United States Patent
Zhao (10) Patent No.: US 11,088,345 B2
(45) Date of Patent: Aug. 10, 2021

(54) ORGANIC LIGHT EMITTING DIODE DISPLAY PANEL AND MANUFACTURING METHOD THEREOF

(71) Applicant: Wuhan China Star Optoelectronics Semiconductor Display Technology Co., Ltd., Hubei (CN)

(72) Inventor: Chen Zhao, Guangdong (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 413 days.

(21) Appl. No.: 16/095,980

(22) PCT Filed: Aug. 27, 2018

(86) PCT No.: PCT/CN2018/102520
§ 371 (c)(1),
(2) Date: Oct. 24, 2018

(87) PCT Pub. No.: WO2020/019394
PCT Pub. Date: Jan. 30, 2020

(65) Prior Publication Data
US 2021/0091337 A1  Mar. 25, 2021

(30) Foreign Application Priority Data
Jul. 27, 2018  (CN) .......................... 201810846097.6

(51) Int. Cl.
*H01L 29/08* (2006.01)
*H01L 51/52* (2006.01)
(Continued)

(52) U.S. Cl.
CPC ...... *H01L 51/5253* (2013.01); *H01L 27/3246* (2013.01); *H01L 27/3258* (2013.01);
(Continued)

(58) Field of Classification Search
CPC ............. H01L 51/5253; H01L 51/5246; H01L 27/3246; H01L 27/3258
See application file for complete search history.

(56) References Cited

U.S. PATENT DOCUMENTS

2011/0038132 A1* 2/2011 Ochiai .................... H01L 24/94
361/760
2014/0183458 A1* 7/2014 Lee .......................... H01L 51/56
257/40
(Continued)

FOREIGN PATENT DOCUMENTS

CN     105098097 A     11/2015
CN     105679969       6/2016
(Continued)

*Primary Examiner* — Phuc T Dang
(74) *Attorney, Agent, or Firm* — Leong C. Lei (57) ABSTRACT

Provided is an organic light emitting diode display panel, including a substrate, a thin film transistor array layer and an organic light emitting diode layer, which are sequentially stacked and disposed on the substrate, and a thin film encapsulation layer covering the organic light emitting diode layer and an inorganic barrier layer disposed on an outer periphery of the thin film encapsulation layer, wherein at least two grooves in circle around a periphery of the organic light emitting diode layer are provided in the non-display area on the thin film transistor array layer, and the at least two grooves are correspondingly disposed to the thin film encapsulation layer, and the thin film encapsulation layer completely covers the organic light emitting diode layer, and fills the grooves corresponding to the thin film encapsulation layer. The OLED display panel possesses a dense and stable package structure.

18 Claims, 4 Drawing Sheets

(51) Int. Cl.
*H01L 27/32* (2006.01)
*H01L 51/56* (2006.01)
(52) U.S. Cl.
CPC .......... *H01L 51/5246* (2013.01); *H01L 51/56* (2013.01); *H01L 2227/323* (2013.01); *H01L 2227/326* (2013.01)

(56) References Cited

U.S. PATENT DOCUMENTS

| | | | | |
|---|---|---|---|---|
| 2014/0217371 | A1* | 8/2014 | Kim | H01L 51/5256 257/40 |
| 2016/0260928 | A1 | 9/2016 | Choi | |
| 2018/0138257 | A1* | 5/2018 | Higano | H01L 27/3244 |
| 2019/0237687 | A1* | 8/2019 | Zhang | H01L 27/3244 |
| 2019/0244974 | A1* | 8/2019 | Chen | H01L 27/3276 |

FOREIGN PATENT DOCUMENTS

| | | |
|---|---|---|
| CN | 107394059 | 11/2017 |
| CN | 108198953 A | 6/2018 |
| CN | 108258146 | 7/2018 |
| CN | 108281458 A | 7/2018 |
| CN | 108695441 A | 10/2018 |

* cited by examiner

ORGANIC LIGHT EMITTING DIODE DISPLAY PANEL AND MANUFACTURING METHOD THEREOF

CROSS REFERENCE

This application is a National Phase of International Application Number PCT/CN2018/102520, filed Aug. 27, 2018, and claims the priority of Chinese Patent Application No. 201810846097.6, entitled "Organic light emitting diode display panel and manufacturing method thereof", filed on Jul. 27, 2018, the disclosure of which is hereby incorporated in its entirety by reference.

FIELD OF THE INVENTION

The present invention relates to a display panel field, and more particularly to an organic light emitting diode display panel and a manufacturing method thereof.

BACKGROUND OF THE INVENTION

OLED (Organic Light-Emitting Diode) display panel has become one of the most promising display technologies due to the properties of self-illumination, wide viewing angle, long life, energy saving and environmental protection; meanwhile, compared with the conventional TFT-LCD (Thin film transistor-liquid crystal display), the biggest advantage of OLED is the capability of being made into a flexible product, which can be bendable/curlable.

However, the OLED device in the OLED display panel is sensitive to water vapor and oxygen in air, and easily reacts with water vapor or oxygen, thereby affecting the luminescence performance and service life. Therefore, OLED devices require a strict packaging process. In the prior art, a Thin Film Encapsulation (TFE) method is often used. Although the packaging method can realize a light and thin film package structure, water vapor (H2O) and oxygen (O2) can be blocked in a certain degree. However, the TFE method has high requirements on the properties of the package thin film material itself, and H2O and O2 may enter the OLED device through gaps between the thin film package structure and the panel layer structure. Particularly, when the OLED display panel is bent, since the thin film encapsulation structure is likely to have the penetration of H2O and O2 in the deformation process to enter into the OLED device, the luminescence service life of the OLED device will be affected.

SUMMARY OF THE INVENTION

An objective of the present invention is to provide an organic light emitting diode display panel and a manufacturing method thereof, which can effectively block water vapor and oxygen in air and improve an illumination service life of the organic light emitting diode display panel.

First, the present invention provides an organic light emitting diode display panel, comprising a substrate, a thin film transistor array layer and an organic light emitting diode layer, which are sequentially stacked and disposed on the substrate, and a thin film encapsulation layer covering the organic light emitting diode layer and an inorganic barrier layer disposed on an outer periphery of the thin film encapsulation layer, wherein at least two grooves in circle around a periphery of the organic light emitting diode layer are provided in the non-display area on the thin film transistor array layer, and the at least two grooves are correspondingly disposed to the thin film encapsulation layer, and the thin film encapsulation layer completely covers the organic light emitting diode layer, and fills the grooves corresponding to the thin film encapsulation layer.

The thin film transistor array layer comprises at least one inorganic material functional layer and an organic material functional layer disposed on the inorganic material functional layer; the thin film encapsulation layer comprises at least one inorganic layer, wherein the inorganic layer is correspondingly provided with at least one of the grooves in circle, and the at least one of the grooves in circle corresponding to the inorganic layer penetrates the organic material functional layer, and a bottom of the at least one of the grooves in circle corresponding to the inorganic layer is located on a surface or an inside of the inorganic material functional layer.

In the non-display area on the thin film transistor array layer, at least one groove corresponding to the inorganic barrier layer is further disposed around the periphery of the organic light emitting diode layer, and the groove corresponding to the inorganic barrier layer penetrates the organic material functional layer, and a bottom of the groove corresponding to the inorganic barrier layer is located on the surface or the inside of the inorganic material functional layer.

A material of the inorganic barrier layer comprises one or more of silicon dioxide (SiO2), silicon nitride (SiNx) and aluminum oxide (Al2O3).

The thin film encapsulation layer comprises a plurality of inorganic layers and an organic layer which are alternately disposed, and each of the inorganic layers and each of the organic layers are provided with at least one of the grooves in circle.

An innermost side and an outermost side of the thin film encapsulation layer are the inorganic layers.

An innermost side of the thin film encapsulation layer is the inorganic layer and an outermost side of the thin film encapsulation layer is the organic layer, and an upper surface of the organic layer of the outermost side is further provided with an additional inorganic layer, and the additional inorganic layer covers the upper surface of the organic layer of the outermost side and an upper surface of the inorganic barrier layer.

A material of the additional inorganic layer and a material of the inorganic barrier layer are different.

In the OLED display panel first provided by the present invention, the grooves are provided in the non-display area of the TFT array substrate, the thin film encapsulation layer completely covers the OLED layer, and fills the grooves corresponding to the thin film encapsulation layer to increase the tightness and stability between the layer structures; meanwhile, the inorganic barrier layer is disposed on the on the outer periphery of the thin film encapsulation layer to form the package on the entire lateral sides of the OLED display panel to further strengthen and stabilize the package structure of the OLED display panel. Thus, the ability of the entire package structure to block water vapor and oxygen is greatly enhanced, thereby protecting the OLED device, and the OLED display panel possesses a longer service life.

Second, the present invention provides a manufacturing method of an organic light emitting diode display panel, comprising steps of:

providing a rigid substrate;

preparing a substrate, a thin film transistor array layer and an organic light emitting diode layer sequentially on the rigid substrate, wherein in a non-display area on the thin film transistor array layer, at least two grooves in circle are prepared around a periphery of the organic light emitting diode layer;

depositing a thin film encapsulation layer on the organic light emitting diode layer, wherein the thin film encapsulation layer is correspondingly disposed to the at least two grooves in circle, and the thin film encapsulation layer completely covers the organic light emitting diode layer and fills the grooves corresponding to the thin film encapsulation layer;

depositing an inorganic barrier layer on an outer periphery of the thin film encapsulation layer; and separating the rigid substrate from the substrate by a laser lift-off process to obtain an organic light emitting diode display panel.

At least one groove corresponding to the inorganic barrier layer is further disposed when the at least two grooves in circle are prepared around the periphery of the organic light emitting diode layer, and the inorganic barrier layer fills the groove corresponding to the inorganic barrier layer.

The manufacturing method of the OLED display panel second provided by the present invention possesses the advantages of simple process and low cost. The manufactured package structure of the film encapsulation layer and the inorganic barrier layer is firm and possesses good air tightness to greatly improve the production quality of the product; the OLED display panel manufactured by the manufacturing method can effectively block water vapor and oxygen and possesses a longer lasting illumination service life.

Third, the present invention provides display apparatus, including the OLED display panel provided first or the OLED display panel manufactured by the manufacturing method of the OLED display panel provided second. Mobile phones, smart watches, computers or monitors can be illustrated for the display apparatus.

The advantages of the invention will be set forth in part in the following specification. A part will be obvious from the specification or may be learned by practice of the embodiments of the invention.

DETAILED DESCRIPTION OF PREFERRED EMBODIMENTS

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

Moreover, the terms "first" and "second" are used for descriptive purposes only and are not to be construed as indicating or implying a relative importance or implicitly indicating the number of indicated technical features. Thus, features defining "first" and "second" may include one or more of the features with either explicitly or implicitly. Besides, in the description of the present invention, "plurality" means two or more unless with being specifically indicated otherwise.

Unless specifically stated, raw materials and other chemical reagents used in the embodiments of the present invention are all commercially available.

Figure 1:
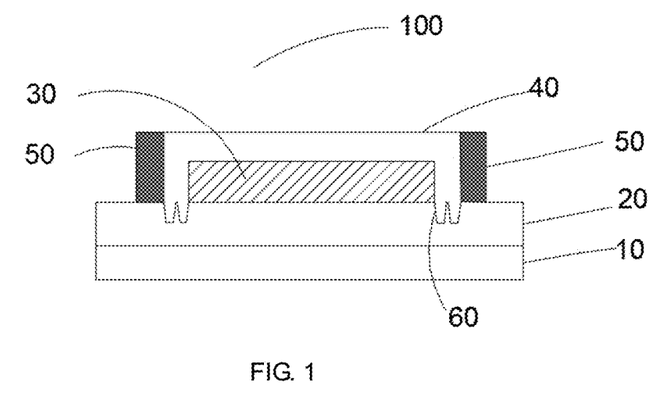
FIG. 1 is a structural diagram of an organic light emitting diode display panel 100 according to one embodiment of the present invention.
Figure 2:
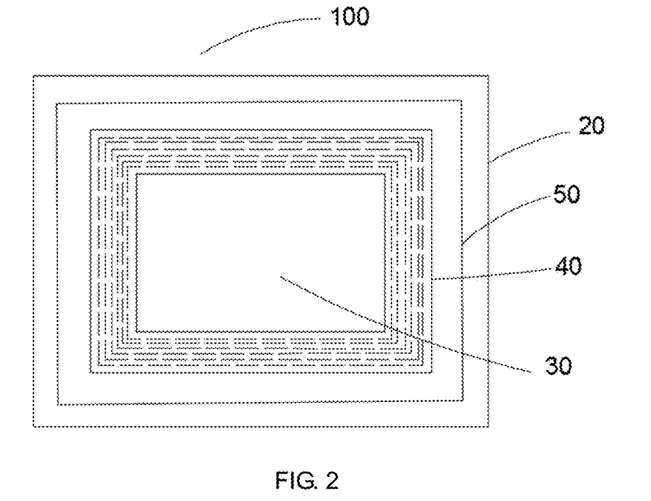
FIG. 2 is a top view structural diagram of an organic light emitting diode display panel 100 according to one embodiment of the present invention.

One embodiment of the present invention provides an organic light emitting diode display panel 100, including a substrate 10, a thin film transistor (TFT) array layer 20 and an organic light emitting diode (OLED) layer 30, which are sequentially stacked and disposed on the substrate 10, and a thin film encapsulation layer 40 covering the OLED layer 30 and an inorganic barrier layer 50 disposed on an outer periphery of the thin film encapsulation layer 40, wherein the TFT array layer 20 includes a display area (AA area) and a non-display area (non-AA area), and at least two grooves 60 in circle around a periphery of the OLED layer 30 are provided in the non-display area on the TFT array layer 20, and the at least two grooves 60 are correspondingly disposed to the thin film encapsulation layer 40, and the thin film encapsulation layer 40 completely covers the OLED layer 30, and fills the grooves 60 corresponding to the thin film encapsulation layer 40 as shown in FIG. 1 and FIG. 2.

In this embodiment, the thin film encapsulation layer 40 covers an entire outer surface of the OLED layer 30. The entire outer surface includes an outer surface of a side of the OLED layer 30 away from the TFT array layer 20 and an entire side of the periphery of the OLED layer 30; the inorganic barrier layer 50 further covers the entire side of the periphery of the thin film encapsulation layer 40. The groove corresponding to the thin film encapsulation layer 40 is disposed in the non-display area of the TFT array layer 20, and the thin film encapsulation layer 40 fills the corresponding grooves to form a gantry shape full package. Then, the contact area and bonding force of the thin film encapsulation layer 40 and the TFT array layer 20 can be greatly increased, and the water vapor and oxygen permeation paths are prolonged, and the water vapor and oxygen are effectively blocked, and the service life of the OLED layer 30 is improved; particularly, when the OLED display panel is a flexible and bendable panel, the thin film encapsulation layer 40 can better protect the OLED layer 30, and the inorganic barrier layer 50 can further form the side package for the OLED layer 30 and the thin film encapsulation layer 40, which makes the whole package structure more firm and more stable to possess stronger resistance to physical impact.

In the present embodiment, the substrate 10 can have good light transmittance. The substrate 10 possesses a barrier function of water vapor and oxygen. Meanwhile, the substrate 10 can also possess better resistance to physical impact, and can effectively protect the TFT array layer 20 and the OLED display panel 100. Optionally, a material of the substrate may include one or more of glass, silicon oxide, polyethylene, polypropylene, polystyrene, polylactic acid, polyethylene terephthalate, polyimide and polyurethane.

In this embodiment, as shown in FIG. 2, the thin film encapsulation layer 40 completely covers the surface of the OLED layer 30 and the entire lateral side of the periphery of the OLED layer 30; a cross-sectional shape of the OLED layer 30 is a rectangle; a cross-sectional shape of the thin film encapsulation layer 40 and a cross-sectional shape of the inorganic barrier layer 50 also are rectangles, correspondingly. In this embodiment, by arranging the thin film encapsulation layer 40 and the inorganic barrier layer 50 respectively to match the OLED layer 30, the OLED layer 30 can be better sealed and protected; meanwhile, the space for use can be greatly saved, and the area usage ratio of the OLED layer 30 in the display area of the TFT array layer 20 can be increased. Optionally, the cross-sectional shape of the OLED layer 30 may be, but is not limited to, a rectangle, a circle, a trapezoid or the like. Optionally, a bottom position of the thin film encapsulation layer 40 is projected on the at least two grooves 60 in circle, and the thin film encapsulation layer 40 fills the corresponding grooves 60 of the thin film encapsulation layer 40. Optionally, the cross-sectional shape of the groove 60 may be, but is not limited to, an inverted trapezoid. Optionally, the cross-sectional shape of the groove 60 may be, but is not limited to, one or more of an inverted trapezoid, a rectangle, an inverted triangle and a semicircle, and the cross-sectional shape of the groove 60 may also be other shapes. In this embodiment, the cross-sectional shape of each of the grooves 60 may be the same or different. Optionally, the OLED layer may include, but is not limited to, an anode, a hole injection layer, a hole transport layer, an organic light emitting layer, an electron transport layer, an electron injection layer and a cathode. The OLED layer 30 can also be other conventional structures, which will be further limited in this embodiment.

In this embodiment, the TFT array layer 20 includes at least one inorganic material functional layer and an organic material functional layer disposed on the inorganic material functional layer. Specifically, the inorganic material functional layer may be, but is not limited to, including any one of a buffer layer, a gate insulating layer (GI) and an interlayer insulating layer (ILD); the organic material functional layer may be, but is not limited to, any one of a planarization layer (PLN) and a pixel definition layer (PDL). In the present embodiment, the inorganic material functional layer and the organic material functional layer are categorized according to the materials of the conventional layer structure of the TFT array layer 20, and are not limited to the inherent conventional layer structure. For instance, when a material of the planarization layer is an inorganic material, the planarization layer may also be the inorganic material functional layer.

Optionally, the thin film encapsulation layer 40 includes at least one inorganic layer. The inorganic layer is correspondingly provided with at least one of the grooves 60 in circle on the TFT array layer 20; the at least one of the grooves in circle corresponding to the inorganic layer penetrates the organic material functional layer, and a bottom of the at least one of the grooves in circle corresponding to the inorganic layer is located on a surface or an inside of the inorganic material functional layer. Optionally, a material of the inorganic layer may include, but is not limited to, one or more of silicon dioxide (SiO2), silicon monoxide (SiO), silicon nitride (SiNx) and aluminum oxide (Al2O3). In the embodiment, the inorganic layer possesses a dense internal molecular structure and a good property of blocking water vapor and oxygen.

Figure 3:
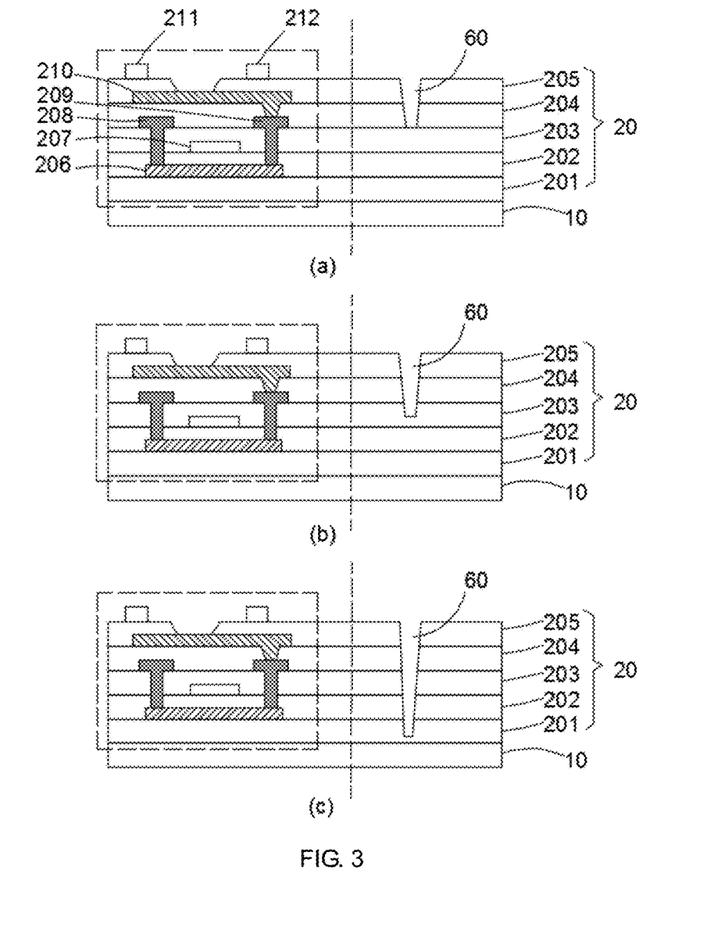
FIG. 3 is a partial cross-sectional structural diagram of a thin film transistor array layer according to one embodiment of the present invention.

Specifically, as shown in FIG. 3, in the partial structure diagram of the TFT array layer 20 and the substrate 10, the left side of the broken line is the display area of the TFT array layer 20, and the right side of the broken line is the non-display area of the TFT array layer 20. Optionally, the TFT array layer 20 may include, but is not limited to, a buffer layer 201, a gate insulating layer 202, an interlayer insulating layer 203, a planarization layer 204 and a pixel definition layer 205 which are sequentially stacked. The display area of the TFT array layer 20 includes a TFT array substrate, as shown by a broken line frame in (a) of FIG. 3, and the dotted line frame is a structural diagram of the TFT array substrate. A polysilicon layer (poly-Si) 206 is disposed inside the gate insulating layer 202. One side of the polysilicon layer 206 is attached to the lower bottom surface of the buffer layer 201 and is adjacent to the upper surface of the buffer layer 201. A gate layer (GE) 207 is disposed inside the interlayer insulating layer (ILD) 203, and one side of the gate layer 207 is attached to the lower bottom surface of the interlayer insulating layer 203 and is adjacent to the upper surface of the gate insulating layer 202. A source 208 and a drain 209 are provided inside the planarization layer 204. The interlayer insulating layer 203 has two holes penetrating through the interlayer insulating layer 203. The gate insulating layer 202 has two holes directly reaching the polysilicon layer 206. The source 208 passes through a hole of the interlayer insulating layer 203 and a hole of the gate insulating layer 202 to be connected to the polysilicon layer 206; the drain 209 passes through another hole of the interlayer insulating layer 203 and another hole of the gate insulating layer 202 to be connected to the polysilicon layer 206. The upper surface of the planarization layer 204 has a hole penetrating the planarization layer 204. An anode 210 is stacked on an upper surface of the planarization layer 204, and two ends of the anode 210 are located inside the pixel definition layer 205, and connected to the drain 209 through a hole of the planarization layer 204. The upper surface of the pixel definition layer 205 is further provided with two photosensitive spacers, which are a first photosensitive spacer 211 and a second photosensitive spacer 212, respectively. In this embodiment, the source 208 and the drain 209 may be exchanged with each other; the amount of the photosensitive spacers may be two but is not limited thereto. The TFT array substrate may also be other structures or similar to the prior art, and will not be described in detail in this embodiment.

Optionally, the inorganic material functional layer of the TFT array layer 20 includes any one of the buffer layer 201, the gate insulating layer 202 and the interlayer insulating layer 203; the organic material functional layer of the TFT array layer 20 includes planarization Layer 204 or pixel definition layer 205. The at least one groove 60 in circle corresponding to the inorganic layer in the film encapsulation layer is illustrated; the bottom of the at least one groove 60 in circle corresponding to the inorganic layer may be located on the surface or the inside of any one of the buffer layer 201, the gate insulating layer 202 and the interlayer insulating layer 203; an opening of the groove 60 corresponding to the inorganic layer is aligned with a surface of the TFT array layer away from the substrate. As shown in (a) of FIG. 3, the groove 60 corresponding to the inorganic layer is disposed in the non-display area and is adjacent to the display area; the cross-sectional shape of the groove 60 corresponding to the inorganic layer is an inverted trapezoid;

the groove 60 corresponding to the inorganic layer penetrates the planarization layer 204 and the pixel definition layer 205; the bottom of the groove 60 corresponding to the inorganic layer is attached to the upper surface of the interlayer insulating layer 203, and the bottom end of the inorganic layer is in direct contact with the interlayer insulating layer 203 to form a seal. Optionally, the bottom of the corresponding groove 60 of the inorganic layer may also be disposed inside the interlayer insulating layer 203, and the bottom end of the inorganic layer is in direct contact with the interlayer insulating layer 203 to form a seal as shown in (b) of FIG. 3. Optionally, as shown in (c) of FIG. 3, the groove 60 corresponding to the inorganic layer may sequentially pass through the pixel definition layer 205, the planarization layer 204, the interlayer insulating layer 203 and the gate insulating layer 202, and the bottom of the groove 60 corresponding to the inorganic layer extends to the inside of the buffer layer 201; correspondingly, the inorganic layer of the thin film encapsulation layer fills the corresponding groove 60 of the inorganic layer, and the bottom end of the inorganic layer of the thin film encapsulation layer is in direct contact with the buffer layer 201 to form a seal.

In this embodiment, the buffer layer 201 in the TFT array layer 20 may include, but is not limited to, one or more inorganic material layers; the material of the inorganic material layer includes one or more of SiO2, SiO, SiNx and Al2O3. For instance, the material of the inorganic material layer is a composite material of SiO2, SiO and SiNx, or a composite material of SiO2, SiO, SiNx and Al2O. The buffer layer can effectively block the penetration of water vapor and oxygen from the buffer layer side of the OLED panel to greatly enhance the ability of the entire OLED display panel to block water vapor and oxygen and to prolong the service life. The buffer layer having a multi-layer inorganic material layer structure can further enhance the ability to block water vapor and oxygen. Other layer structures in the TFT array layer 20, such as a gate insulating layer, a planarization layer and the like may be prior art and are not limited in the embodiment.

In this embodiment, the thin film encapsulation layer 40 may include, but is not limited to, at least one organic layer, and the organic layer is correspondingly provided with at least one groove in circle on the TFT array layer 20. The bottom of the groove corresponding to the organic layer may be located in any one of the pixel definition layer 205, the planarization layer 204, the interlayer insulating layer 203, the gate insulating layer 202 and the buffer layer 201. Preferably, the groove corresponding to the organic layer penetrates the pixel definition layer 205, and the bottom of the groove corresponding to the organic layer is located inside the planarization layer 204, and the organic layer fills the groove corresponding to the organic layer, and the bottom end of the organic layer is in direct contact with the planarization layer 204 to form a seal. Optionally, a material of the organic layer may include, but is not limited to, one or more of polyethylene, polypropylene, polystyrene, polylactic acid, polyethylene terephthalate, polyimide and polyurethane. In this embodiment, the organic layer also possesses a certain ability to block water vapor and oxygen; meanwhile, the organic layer may absorb or disperse stress between the interlayer structure in the thin film encapsulation layer to prevent the inorganic layer from being cracked due to the inherent brittleness and defects.

In this embodiment, the thin film encapsulation layer may be, but is not limited to, an inorganic layer and an organic layer which are alternately stacked in a plurality of layers. The arrangement of the inorganic layer and the organic layer of the thin film encapsulation layer can be written as A-B-A-B-A-B-A . . . , i.e., (AB)nA, wherein n is an integer greater than or equal to 1, and A represents an inorganic layer and B represents an organic layer. Optionally, an innermost side and an outermost side in the multilayer structure of thin film encapsulation layer are the inorganic layers. In this embodiment, the multi-layer film encapsulation layer extends the permeation path of the water vapor and oxygen, and possesses the superior ability to block water vapor and oxygen. Meanwhile, by configuring the groove structure, the connection between the thin film encapsulation layer and the TFT array layer is more dense and stable, and it is difficult to infiltrate water vapor and oxygen from the connection gap. Optionally, each of the inorganic layer and the organic layer may be provided with at least one groove in circle in the non-display area of the TFT array layer. The depth, width (or thickness) or cross-sectional shape of each of the inorganic or the organic layer corresponding to the grooves may be the same or different. Furthermore, optionally, the bottom of the groove corresponding to the inorganic layer extends to the surface or inside of the inorganic material functional layer of the TFT array layer; the bottom of the groove corresponding to the organic layer extends to the surface or inside of the inorganic material functional layer or the organic material functional layer of the TFT array layer. Preferably, the bottom of the groove corresponding to the organic layer extends to the surface or inside of the inorganic material functional layer or the organic material functional layer of the TFT array layer. In this embodiment, the thin film encapsulation layer possesses good light transmittance, and does not greatly affect the display effect of the OLED display panel.

Figure 4:
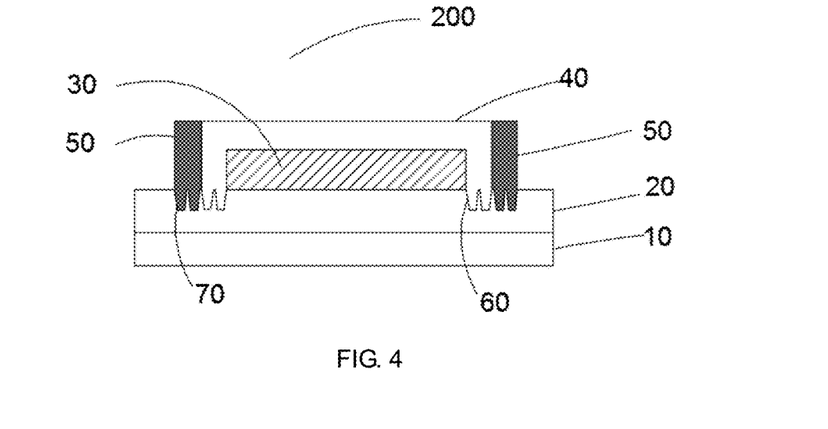
FIG. 4 is a structural diagram of an organic light emitting diode display panel 200 according to another embodiment of the present invention.

In this embodiment, in the non-display area on the thin film transistor array layer, at least one groove corresponding to the inorganic barrier layer is further disposed around the periphery of the organic light emitting diode layer, and the groove corresponding to the inorganic barrier layer penetrates the organic material functional layer, and a bottom of the groove corresponding to the inorganic barrier layer is located on the surface or the inside of the inorganic material functional layer. As shown in FIG. 4, the another embodiment of the present invention provides an organic light emitting diode display panel 200, wherein two grooves 70 in circle corresponding to the inorganic barrier layer 50 are provided around a periphery of the OLED layer 30. The inorganic barrier layer 50 fills the two grooves 70 in circle corresponding to the inorganic barrier layer 50. Optionally, the depths, widths (or thicknesses) or cross-sectional shapes of the groove 70 corresponding to the inorganic barrier layer 50 and the groove 60 corresponding to any inorganic of the encapsulating layers 40 may be the same or different. Optionally, a material of the inorganic barrier layer 50 includes one or more of silicon dioxide, silicon nitride and aluminum oxide. Optionally, the material of the inorganic barrier layer may also be other metal oxide or inorganic materials having a dense molecular structure. In this embodiment, a complete package structure can be formed between the thin film encapsulation layer and the TFT array layer, which can effectively block external water vapor and oxygen and protect the OLED layer; the inorganic barrier layer may further enhance the barrier effect, and the inorganic barrier layer may also protect the interface between the thin film encapsulation layer and the TFT array layer in certain degree. Meanwhile, when the bottom of the groove corresponding to the inorganic layer or the inorganic barrier layer in the thin film encapsulation layer is in direct contact with the inorganic material functional layer in the TFT array layer, since the bonding between the molecules of the similar material is more dense, the inorganic layer or the inorganic barrier layer fills the corresponding grooves to form a more stable package structure, and to possess an excellent barrier function.

Figure 5:
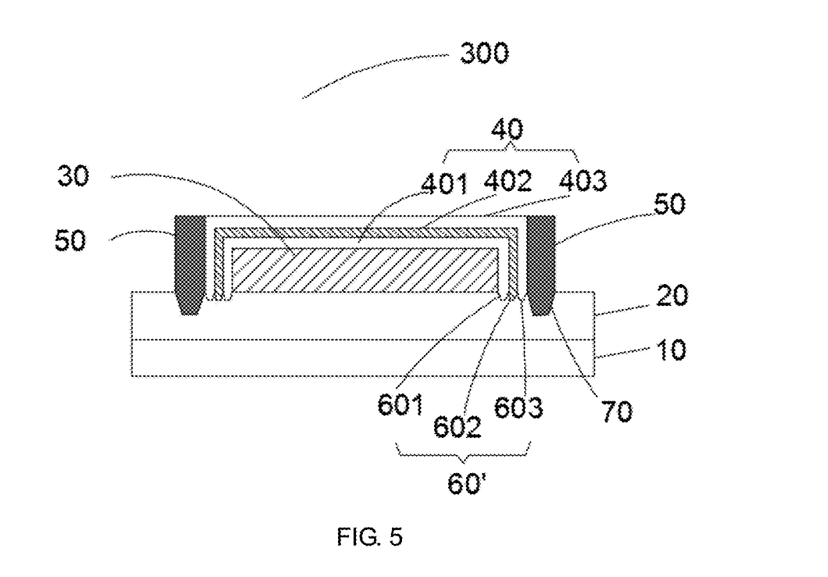
FIG. 5 is a structural diagram of an organic light emitting diode display panel 300 according to another embodiment of the present invention.

As shown in FIG. 5, one embodiment of the present invention provides an organic light emitting diode display panel 300, including a substrate 10, a TFT array layer 20 and an OLED layer 30, which are sequentially stacked and disposed on the substrate 10, and a thin film encapsulation layer 40 covering the OLED layer 30 and an inorganic barrier layer 50 disposed on an outer periphery of the thin film encapsulation layer 40, wherein at least three grooves 60' in circle corresponding to the thin film encapsulation layer 40 and one groove 70 in circle corresponding to the inorganic barrier layer 50 are provided in the non-display area on the TFT array layer 20 around a periphery of the OLED layer 30; the thin film encapsulation layer 40 includes a three layers structure, in which of the first inorganic layer 401, the organic layer 402 and the second inorganic layer 403 are alternately stacked. The first inorganic layer 401, the organic layer 402 and the second inorganic layer 403 respectively correspond to one groove in circle; the first inorganic layer 401 corresponds to the groove 601, the organic layer 402 corresponds to the groove 602 and the second inorganic layer 403 corresponds to the groove 603; the first inorganic layer 401 is the innermost layer of the thin film encapsulation layer 40, and the first inorganic layer 401 completely covers the OLED layer 30 and fills the groove 601 corresponding to the inorganic layer 401; the organic layer 402 completely covers the first inorganic layer 401 and fills the groove 602 corresponding to the organic layer 402; the second inorganic layer 403 as the outermost layer of the thin film encapsulation layer 40 completely covers the organic layer 402 and fills the groove 603 corresponding to the second inorganic layer 403. In this embodiment, the cross-sectional shapes and/or depths of the grooves corresponding to the first inorganic layer 401, the organic layer 402 and the second inorganic layer 403 may be the same or different.

Optionally, the specific thickness of the thin film encapsulation layer 40 or the inorganic barrier layer 50 is not specifically limited. The specific thickness of the thin film encapsulation layer 40 or the inorganic barrier layer 50 may vary according to the product type and size of the OLED display panel; the specific thickness of the thin film encapsulation layer 40 or the inorganic barrier layer 50 may also be adjusted by a preparation process. For instance, the thickness of the thin film encapsulation layer 40 may be, but not limited to, 0.5 to 50 µm. Optionally, the thickness of the thin film encapsulation layer is 0.5-30 µm. Furthermore, optionally, the thickness of the thin film encapsulation layer is 10-25 µm. For instance, the thickness of the thin film encapsulation layer 40 may be 5 µm, 15 µm or 20 µm. Optionally, the thickness of the inorganic barrier layer 50 is 0.5 to 25 µm. Optionally, the thickness of the inorganic barrier layer 50 is 0.5 to 20 µm. Furthermore, optionally, the thickness of the inorganic barrier layer 50 is 2 to 15 µm. For instance, the thickness of the inorganic barrier layer may be 5 µm, 8 µm or 10 µm.

Optionally, the thickness of the thin film encapsulation layer may be greater than or equal to an opening cross-sectional width of the groove corresponding to the thin film encapsulation layer; the thickness of the inorganic barrier layer may be greater than or equal to an opening cross-sectional width of the groove corresponding to the inorganic barrier layer. Furthermore, optionally, the thickness of the thin film encapsulation layer may be greater than the opening cross-sectional width of the groove corresponding to the thin film encapsulation layer; the thickness of the inorganic barrier layer may be greater than the opening cross-sectional width of the groove corresponding to the inorganic barrier layer. Optionally, the thickness of the inorganic barrier layer is greater than the thickness of the thin film encapsulation layer; the inorganic barrier layer possesses an outstanding physical impact resistance. The thickness of the thin film encapsulation layer or the thickness of the inorganic barrier layer refers to a thickness exposed outside the TFT array layer but not the thickness of the thin film encapsulation layer or the thickness of the inorganic barrier layer inserted into the TFT array layer.

Figure 6:
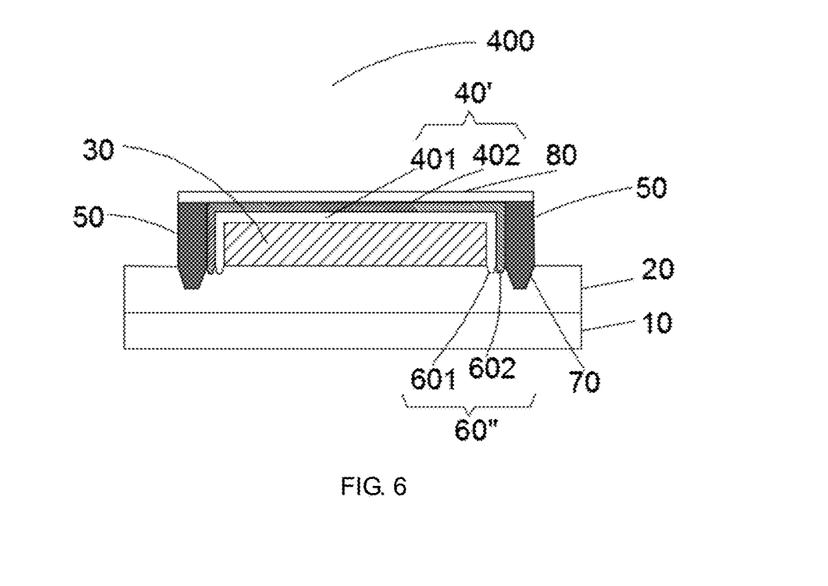
FIG. 6 is a structural diagram of an organic light emitting diode display panel 400 according to another embodiment of the present invention.

As shown in FIG. 6, another embodiment of the present invention provides an organic light emitting diode display panel 400. Compared with the OLED display panel 300, the OLED display panel 400 includes at least three grooves 60" in circle corresponding to the thin film encapsulation layer 40' are provided around a periphery of the OLED layer 30, and the thin film encapsulation layer 40' includes a first inorganic layer 401 and an organic layer 402; the first inorganic layer 401 corresponds to the groove 601, the organic layer 402 corresponds to the groove 602; an upper surface of the organic layer of the organic layer 402 is further provided with an additional inorganic layer 80, and the additional inorganic layer 80 covers the upper surface of the organic layer 402 of the outermost side of the thin film encapsulation layer 40' and an upper surface of the inorganic barrier layer 50. Optionally, the upper surface of the organic layer 402 refers to the surface at one side of the organic layer 401 away from the first inorganic layer 401; the upper surface of the inorganic barrier layer 50 refers to the surface at one side of the inorganic barrier layer 50 away from the TFT array layer. In this embodiment, the upper surface of the organic layer 402 and the upper surface of the inorganic barrier layer 50 may be aligned but are not limited thereto. The upper surface of the organic layer 402 and the upper surface of the inorganic barrier layer 50 may also have a height difference, and the height difference may be adjusted according to the product or the preparation process, and is not limited in the embodiment. When the upper surface of the organic layer 402 and the upper surface of the inorganic barrier layer 50 may be aligned, the additional inorganic layer 80 may be, but not limited to, a planar structure, and the additional inorganic layer 80 is closely adhered to the upper surface of the organic layer 402, and the additional inorganic layer 80 is closely adhered to the upper surface of the inorganic barrier layer 50; a good seal is formed between the additional inorganic layer 80 and the organic layer 402 or the inorganic barrier layer 50, respectively. When the upper surface of the organic layer 402 and the upper surface of the inorganic barrier layer 50 have the height difference, a good seal is still formed between the additional inorganic layer 80 and the organic layer 402 or the inorganic barrier layer 50, respectively.

Optionally, the material of the additional inorganic layer 80 and the first inorganic layer 401 may be the same or different. Optionally, the material of the additional inorganic layer 80 and the first inorganic layer 401 may be the same or different. The material of the additional inorganic layer 80 and the material of the inorganic barrier layer are different. Optionally, the thickness of the additional inorganic layer 80 and the first inorganic layer 401 may be the same or different.

In this embodiment, the additional inorganic layer 80 and the inorganic barrier layer 50 may be sealed by an adhesive. The additional inorganic layer 80 cannot only further effectively block water vapor and oxygen but also provide a tighter connection between the inorganic barrier layer 50 and the thin film encapsulation layer 40'. The organic layer 402 of the outermost side of the thin film encapsulation layer 40' is tightly bonded to the inorganic barrier layer 50, and the organic layer 402 can serve as a buffer between the first inorganic layer 401 and the inorganic barrier layer 50, so that the entire package structure is firm and stable. The additional inorganic layer 80 and the inorganic barrier layer 50 are made of different materials, and the additional inorganic layer 80 possesses better flexibility and light transmittance, which is beneficial to realize the curved display of the OLED display panel; the inorganic barrier layer 50 can be relatively poor in light transmittance but possess excellent impact resistance and resistance to water vapor and oxygen. In this embodiment, the thickness of the inorganic barrier layer 50 is larger than the thickness of the thin film encapsulation layer 40'.

Optionally, the thin film encapsulation layer 40' may be, but is not limited to, an inorganic layer and an organic layer which are alternately stacked in a plurality of layers. The arrangement of the inorganic layer and an organic layer which are alternately stacked in a plurality of layers can be written as A-B-A-B-A-B . . . , i.e., (AB)n, wherein n is an integer greater than or equal to 1, and A represents an inorganic layer and B represents an organic layer. An innermost side of the thin film encapsulation layer is the inorganic layer and an outermost side of the thin film encapsulation layer is the organic layer.

In all embodiments of the present invention, all of the grooves on the TFT array layer including grooves corresponding to the thin film encapsulation layer and grooves corresponding to the inorganic barrier layer are disposed in the non-display area on the TFT array layer, and surround the periphery of the OLED layer in circles. The grooves, including the grooves corresponding to the thin film encapsulation layer and the grooves corresponding to the inorganic barrier layer do not affect signals of the GOA (Gate Driver On Array) in the TFT array layer, and do not cause a malfunction of the display area of the OLED display panel 100 of the present invention. In addition, the OLED display panel of the present invention possesses the grooves corresponding to the thin film encapsulation layer in the non-display area of the TFT array layer and the inorganic barrier layer is used, the package structure of the entire OLED display panel is firm and stable. It is possible to effectively avoid the looseness or the occurrence of gaps in the connection of the thin film encapsulation layer when the display panel is subjected to curved display or vibration, thereby greatly improving the sealing effect of the entire OLED display panel and improving the illumination service life of the OLED device. The package structure of the OLED display panel of the present invention is formed by preparing the thin film encapsulation layer and the inorganic barrier layer on the TFT array layer, and the package structure will not be affected by the ability of the substrate of the OLED display panel of blocking H2O and O2.

Figure 7:
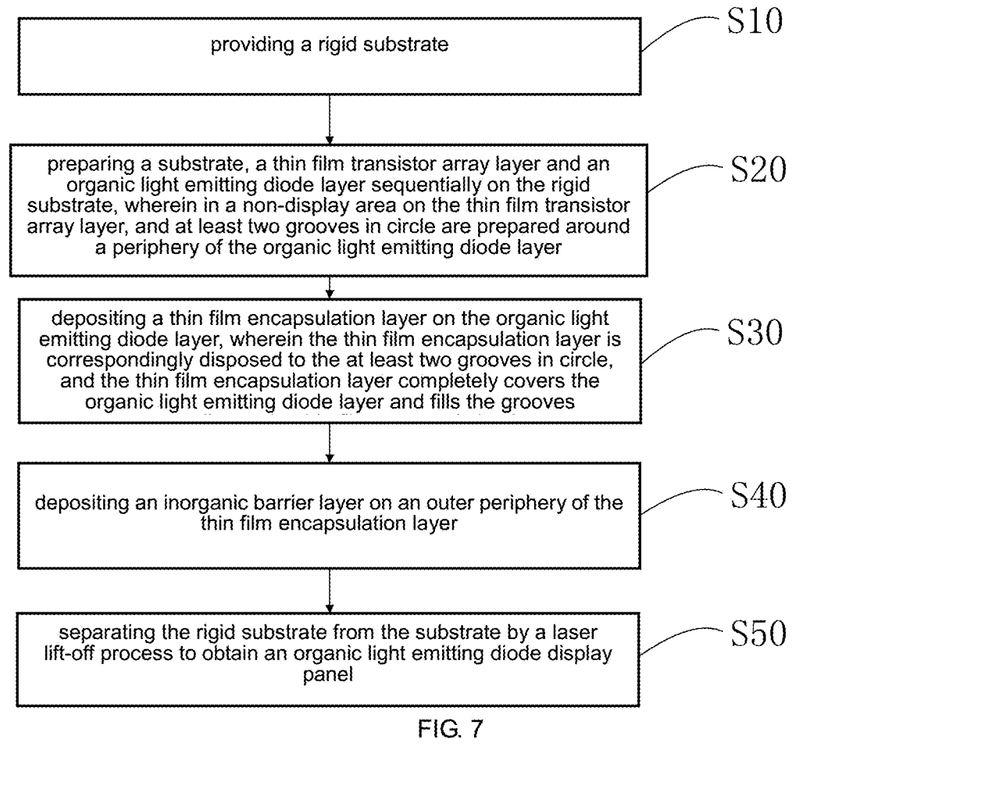
FIG. 7 is a flowchart of a manufacturing method of an organic light emitting diode display panel according to one embodiment of the present invention.

As shown in FIG. 7, the one embodiment of the present invention further provides a manufacturing method of an organic light emitting diode display panel, comprising steps of:

S10, providing a rigid substrate;

S20, preparing a substrate, a thin film transistor array layer and an organic light emitting diode layer sequentially on the rigid substrate, wherein in a non-display area on the thin film transistor array layer, and at least two grooves in circle are prepared around a periphery of the organic light emitting diode layer;

S30, depositing a thin film encapsulation layer on the organic light emitting diode layer, wherein the thin film encapsulation layer is correspondingly disposed to the at least two grooves in circle, and the thin film encapsulation layer completely covers the organic light emitting diode layer and fills the grooves corresponding to the thin film encapsulation layer;

S40, depositing an inorganic barrier layer on an outer periphery of the thin film encapsulation layer; and S50, separating the rigid substrate from the substrate by a laser lift-off process to obtain an organic light emitting diode display panel.

In Step S10 of this embodiment, the rigid substrate may be made of a glass substrate, a silicon wafer, a metal or other rigid film, and the rigid substrate may be, but not limited to, having a high laser transmittance to facilitate the success progress of the subsequent laser stripping process. Certainly, for better combination of the rigid substrate and the subsequent substrate layer, the rigid substrate can be implemented with a surface treatment to improve the surface energy of the rigid substrate.

In the embodiment of the present invention, in Step S20, the substrate may be made of a rigid material or a flexible material. Specifically, a material of the substrate may include one or more of glass, polyethylene, polypropylene, polystyrene, polylactic acid, polyethylene terephthalate, polyimide and polyurethane. The TFT array layer and the OLED layer may be, but are not limited to, a conventional structure. The specific preparation process of the TFT array layer and the OLED layer is not limited in this embodiment. At least two grooves in circle are formed in the non-display area on the TFT array layer by a photomask process or an etching process around the periphery of the organic light emitting diode layer. A cross-sectional shape of the grooves is one or more of a rectangle, an inverted triangle, an inverted trapezoid and a semicircle. Optionally, the at least two grooves in circle can be prepared before preparing the OLED layer after the accomplishment of preparing the TFT array substrate; the position of the OLED layer is disposed first on the TFT array layer, and then the at least two grooves in circle are prepared, and then the OLED layer is prepared.

Optionally, the TFT array layer may include, but is not limited to, a buffer layer, a gate insulating layer, an interlayer insulating layer, a planarization layer and a pixel definition layer which are sequentially stacked. The surface of one side of the TFT array layer away from the substrate in the non-display area is etched to form the grooves corresponding to the thin film encapsulation layer by using the etching process, the grooves corresponding to the thin film encapsulation layer partially penetrate the TFT array layer; the bottom of the grooves corresponding to the thin film encapsulation layer are located in any one of the buffer layer, the gate insulating layer, the interlayer insulating layer, the planarization layer and the pixel definition layer.

In Step S30 of this embodiment, the thin film encapsulation layer is prepared on the OLED layer by plasma enhanced chemical vapor deposition or magnetron sputtering, and the thin film encapsulation layer includes at least one inorganic layer. Optionally, the thin film encapsulation layer may include a plurality of layers of inorganic layers and organic layers arranged in a staggered manner; each of the organic layers or organic layers is correspondingly provided with at least one groove. Meanwhile, the thin film encapsulation layer fills the grooves corresponding to the thin film encapsulation layer in the non-display area on the TFT array layer in Step S20. A material of the inorganic layer includes one or more of SiO2, SiO, SiNx and Al2O3. A material of the organic layer comprises one or more of polyethylene, polypropylene, polystyrene, polylactic acid, polyethylene terephthalate, polyimide and polyurethane.

In the embodiment of the present invention, in Step S40, the inorganic barrier layer is deposited on an outer periphery of the thin film encapsulation layer by plasma enhanced chemical vapor deposition or magnetron sputtering. A material of the inorganic barrier layer includes one or more of SiO2, SiNx and Al2O3.

Optionally, in Step S10, at least one groove corresponding to the inorganic barrier layer is further disposed when the at least two grooves in circle are prepared around the periphery of the organic light emitting diode layer; in Step S40, the inorganic barrier layer fills the groove corresponding to the inorganic barrier layer.

In Step S50, of this embodiment of the present invention, the rigid substrate is separated from the substrate by a laser lift-off process. The specific operation of the step can be: the 343 nm laser is irradiated onto the rigid substrate to melt a portion of the substrate near the rigid substrate, thereby separating the substrate from the rigid substrate by the laser lift-off process to obtain the OLED display panel.

Specifically, modifications and variations of the above-described embodiments may be made by those skilled in the art to which the present invention pertains, depending on the disclosure and description of the foregoing specification. Accordingly, the invention is not limited to the specific embodiments disclosed and described above, and some equivalent modifications and variations of the invention are intended to be within the scope of the appended claims. In addition, although some particular terms are used in this specification, these terms are for convenience of illustration only and are not intended to limit the invention any way.

What is claimed is:

1. An organic light emitting diode display panel, comprising a substrate, a thin film transistor array layer and an organic light emitting diode layer, which are sequentially stacked and disposed on the substrate, and a thin film encapsulation layer covering the organic light emitting diode layer and an inorganic barrier layer disposed on an outer periphery of the thin film encapsulation layer, wherein at least two grooves in circle around a periphery of the organic light emitting diode layer are provided in a non-display area on the thin film transistor array layer, and the at least two grooves are correspondingly disposed to the thin film encapsulation layer, and the thin film encapsulation layer completely covers the organic light emitting diode layer, and fills the grooves corresponding to the thin film encapsulation layer, wherein the thin film transistor array layer comprises at least one inorganic material functional layer and an organic material functional layer disposed on the inorganic material functional layer; the thin film encapsulation layer comprises at least one inorganic layer, wherein the inorganic layer is correspondingly provided with at least one of the grooves in circle, and the at least one of the grooves in circle corresponding to the inorganic layer penetrates the organic material functional layer, and a bottom of the at least one of the grooves in circle corresponding to the inorganic layer is located on a surface or an inside of the inorganic material functional layer.

2. The organic light emitting diode display panel according to claim 1, wherein in the non-display area on the thin film transistor array layer, at least one groove corresponding to the inorganic barrier layer is further disposed around the periphery of the organic light emitting diode layer, and the groove corresponding to the inorganic barrier layer penetrates the organic material functional layer, and a bottom of the groove corresponding to the inorganic barrier layer is located on the surface or the inside of the inorganic material functional layer.

3. The organic light emitting diode display panel according to claim 1, wherein a material of the inorganic barrier layer comprises one or more of silicon dioxide, silicon nitride and aluminum oxide.

4. The organic light emitting diode display panel according to claim 1, wherein the thin film encapsulation layer comprises a plurality of inorganic layers and an organic layer which are alternately disposed, and each of the inorganic layer and each of the organic layer are provided with at least one of the grooves in circle.

5. The organic light emitting diode display panel according to claim 4, wherein an innermost side and an outermost side of the thin film encapsulation layer are the inorganic layers.

6. The organic light emitting diode display panel according to claim 4, wherein an innermost side of the thin film encapsulation layer is the inorganic layer and an outermost side of the thin film encapsulation layer is the organic layer, and an upper surface of the organic layer of the outermost side is further provided with an additional inorganic layer, and the additional inorganic layer covers the upper surface of the organic layer of the outermost side and an upper surface of the inorganic barrier layer.

7. The organic light emitting diode display panel according to claim 6, wherein a material of the additional inorganic layer and a material of the inorganic barrier layer are different.

8. The organic light emitting diode display panel according to claim 4, wherein a material of the inorganic layer comprises one or more of silicon dioxide, silicon monoxide, silicon nitride and aluminum oxide.

9. The organic light emitting diode display panel according to claim 4, wherein a material of the organic layer comprises one or more of polyethylene, polypropylene, polystyrene, polylactic acid, polyethylene terephthalate, polyimide and polyurethane.

10. The organic light emitting diode display panel according to claim 1, wherein a cross-sectional shape of the grooves is one or more of an inverted trapezoid, a rectangle, an inverted triangle and a semicircle.

11. A manufacturing method of an organic light emitting diode display panel, comprising steps of:
providing a rigid substrate;
preparing a substrate, a thin film transistor array layer and an organic light emitting diode layer sequentially on the rigid substrate, wherein in a non-display area on the thin film transistor array layer, at least two grooves in circle are prepared around a periphery of the organic light emitting diode layer;
depositing a thin film encapsulation layer on the organic light emitting diode layer, wherein the thin film encapsulation layer is correspondingly disposed to the at least two grooves in circle, and the thin film encapsulation layer completely covers the organic light emitting diode layer and fills the grooves corresponding to the thin film encapsulation layer;
depositing an inorganic barrier layer on an outer periphery of the thin film encapsulation layer; and
separating the rigid substrate from the substrate by a laser lift-off process to obtain an organic light emitting diode display panel;

wherein the thin film transistor array layer comprises at least one inorganic material functional layer and an organic material functional layer disposed on the inorganic material functional layer; the thin film encapsulation layer comprises at least one inorganic layer, wherein the inorganic layer is correspondingly provided with at least one of the grooves in circle, and the at least one of the grooves in circle corresponding to the inorganic layer penetrates the organic material functional layer, and a bottom of the at least one of the grooves in circle corresponding to the inorganic layer is located on a surface or an inside of the inorganic material functional layer.

12. The manufacturing method of the organic light emitting diode display panel according to claim 11, wherein at least one groove corresponding to the inorganic barrier layer is further disposed when the at least two grooves in circle are prepared around the periphery of the organic light emitting diode layer, and the inorganic barrier layer fills the groove corresponding to the inorganic barrier layer.

13. The manufacturing method of the organic light emitting diode display panel according to claim 12, wherein the thin film transistor array layer comprises at least one inorganic material functional layer and an organic material functional layer disposed on the inorganic material functional layer; the groove corresponding to the inorganic barrier layer penetrates the organic material functional layer, and a bottom of the groove corresponding to the inorganic barrier layer is located on the surface or the inside of the inorganic material functional layer.

14. The manufacturing method of the organic light emitting diode display panel according to claim 11, wherein the thin film encapsulation layer comprises a plurality of inorganic layers and an organic layer which are alternately disposed, and each of the inorganic layer and each of the organic layer are provided with at least one of the grooves in circle.

15. The manufacturing method of the organic light emitting diode display panel according to claim 14, wherein an innermost side and an outermost side of the thin film encapsulation layer are the inorganic layers.

16. The manufacturing method of the organic light emitting diode display panel according to claim 14, wherein an innermost side of the thin film encapsulation layer is the inorganic layer and an outermost side of the thin film encapsulation layer is the organic layer, and an upper surface of the organic layer of the outermost side is further provided with an additional inorganic layer, and the additional inorganic layer covers the upper surface of the organic layer of the outermost side and an upper surface of the inorganic barrier layer.

17. The manufacturing method of the organic light emitting diode display panel according to claim 16, wherein a material of the additional inorganic layer and a material of the inorganic barrier layer are different.

18. The manufacturing method of the organic light emitting diode display panel according to claim 11, wherein a cross-sectional shape of the grooves is one or more of an inverted trapezoid, a rectangle, an inverted triangle and a semicircle.

* * * * *